United States Patent [19]
Kubo

[11] Patent Number: 5,463,241
[45] Date of Patent: Oct. 31, 1995

[54] INSULATED-GATE SEMICONDUCTOR DEVICE WITH A BURIED INSULATION LAYER

[75] Inventor: Masahiko Kubo, Chiba, Japan

[73] Assignee: Kabushiki Kaisha Toshiba, Kawasaki, Japan

[21] Appl. No.: 298,668

[22] Filed: Aug. 31, 1994

[30] Foreign Application Priority Data

Sep. 1, 1993 [JP] Japan ................................ 5-217602
Aug. 25, 1994 [JP] Japan ................................ 6-200473

[51] Int. Cl.⁶ .......................... H01L 27/08; H01L 27/12
[52] U.S. Cl. .................... 257/376; 257/139; 257/368; 257/374; 257/382; 257/394
[58] Field of Search ............................. 257/139, 329, 257/330, 368, 372–376, 382, 394

[56] References Cited

U.S. PATENT DOCUMENTS

| 4,700,454 | 10/1987 | Baerg et al. | 257/374 |
|---|---|---|---|
| 4,720,739 | 1/1988 | Beasom | 257/374 |
| 4,786,952 | 11/1988 | MacIver et al. | 257/329 |
| 5,298,780 | 3/1994 | Harada | 257/330 |

FOREIGN PATENT DOCUMENTS

| 63-186463 | 8/1988 | Japan | 257/372 |
|---|---|---|---|
| 63-194353 | 8/1988 | Japan | 257/394 |
| 2-46765 | 2/1990 | Japan | 257/382 |
| 2-312281 | 12/1990 | Japan | 257/330 |
| 4-2169 | 1/1992 | Japan | 257/139 |
| 4-229662 | 8/1992 | Japan | 257/329 |

*Primary Examiner*—Mahshid D. Saadat
*Attorney, Agent, or Firm*—Oblon, Spivak, McClelland, Maier & Neustadt

[57] ABSTRACT

An insulated gate semiconductor device such as a MOSFET realizes high-frequency high-output operations. A first main electrode (1a) set at grounding potential is Formed on the bottom surface of a substrate. A second main electrode region (4) set at power source potential is formed on the top surface of the substrate. This structure involves very low grounding inductance. A buried insulation film (9) is formed under the second main electrode region, to reduce capacitance and improve power gains at high frequencies. Unlike an ordinary SOI semiconductor device, the buried insulation film of this MOSFET is not entirely formed through the substrate. A conductive region (10) is formed from the top surface to the bottom surface of the substrate at a location where the insulation film is not present, to improve heat dissipation and provide high output power. The buried insulation film (9) is formed by SIMOX, buried epitaxy, or silicon direct bonding (SDB) method.

27 Claims, 11 Drawing Sheets

INSULATED-GATE SEMICONDUCTOR DEVICE WITH A BURIED INSULATION LAYER

BACKGROUND OF THE INVENTION

1. Field of the Invention

The present invention relates to an insulated gate semiconductor device such as a MIS transistor, and particularly, to a semiconductor device capable of reducing drain capacitance and grounding inductance, to realize high power gains at high frequencies.

2. Description of the Prior Art

Figure 18:
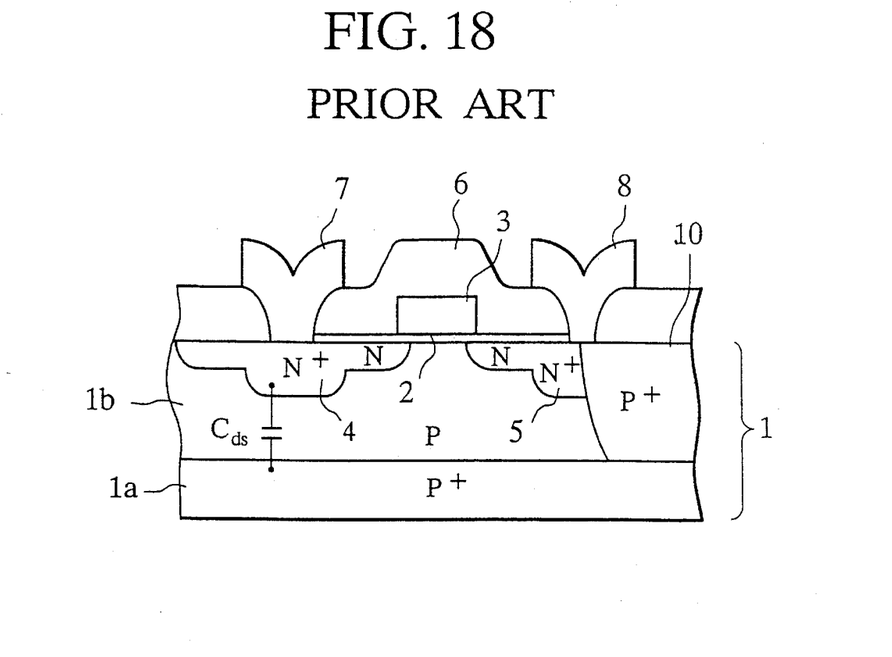
FIGS. 18 and 19 are sectional views showing conventional MOSFETs.
Figure 19:
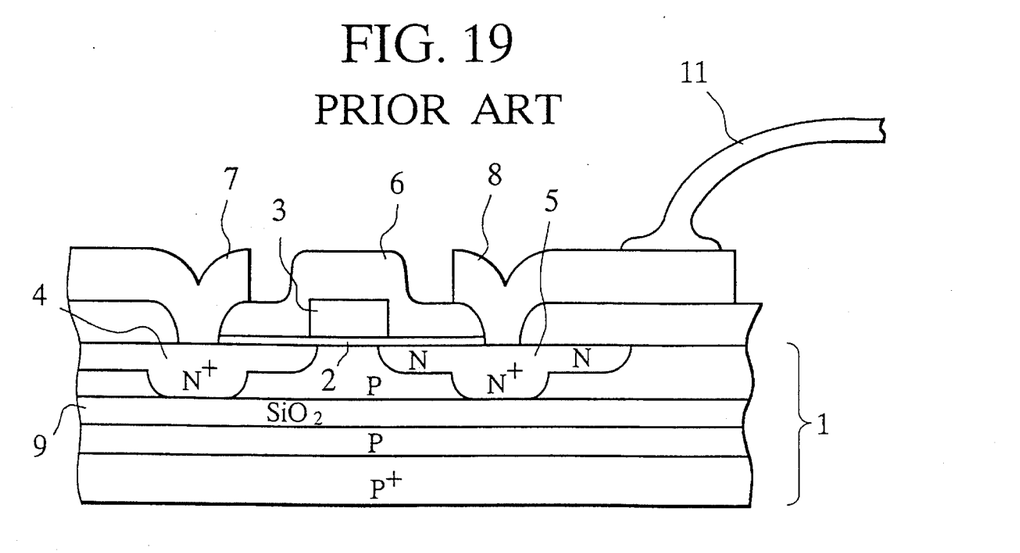

FIGS. 18 and 19 are sectional views showing conventional MOSFETs. The MOSFET of FIG. 18 employs a p silicon wafer 1 including an n+ drain region 4 and an n+ source region 5. A thin gate oxide film 2 of 50 to 100 nanometers thick is formed on the wafer 1, and a gate electrode 3 is formed on the gate oxide film 2. An insulation film 6 made of, for example, PSG covers the gate electrode 3. The wafer 1 is composed of a p+ semiconductor substrate 1a and a p semiconductor layer 1b epitaxially grown on the substrate 1a. The gate electrode 3 is made of polycrystalline silicon, refractory metal, or silicide of the refractory metal. A p+ diffusion region 10 extends from the top surface of the layer 1b to the substrate 1a. The diffusion region 10 is electrically connected to a source electrode 8, to ground the source to the substrate 1a.

The MOSFET of FIG. 19 employs an SOI (Silicon on Insulator) structure. A gate oxide film 2 is formed on a silicon wafer 1 between an n+ drain region 4 and an n+ source region 5. A gate electrode 3 is formed on the gate oxide film 2. The SOI structure is usually composed of an insulator and silicon disposed on the insulator. The structure of FIG. 19 interposes an oxide film 9 between silicon layers. The oxide film 9 is in contact with the bottoms of the drain and source regions 4 and 5. The oxide film 9 is entirely formed through the wafer 1. The drain region 4 extends in a p semiconductor layer of the wafer 1 and is electrically connected to a drain wiring electrode 7. The source region 5 extends in the same p semiconductor layer of the wafer i and is electrically connected to a source wiring electrode 8. The electrode 8 has a bonding area for a grounding wire 11 for grounding the source.

Figure 20:
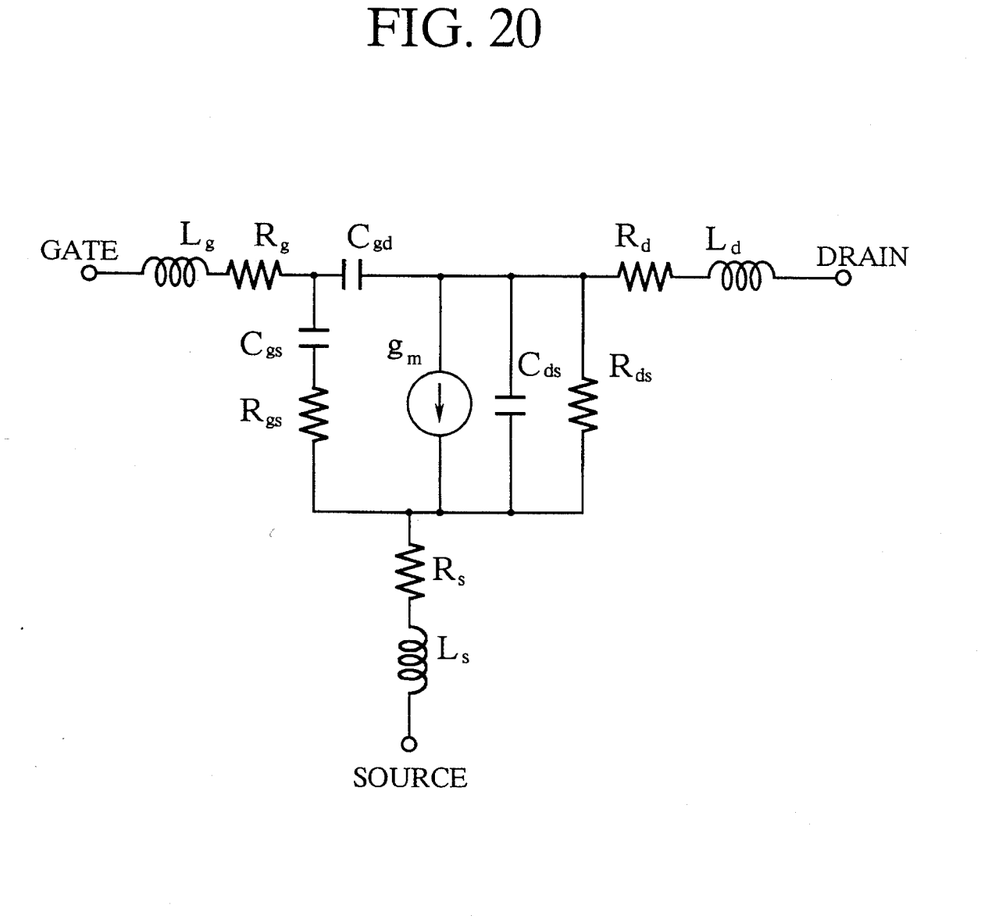
FIG. 20 is a typical equivalent circuit of a high-frequency MOSFET.

MOSFETs are frequently used for high-frequency circuits. One of the important factors of such MOSFETs is power gains at high frequencies. The larger the power gains the better. To increase the power gains, the MOSFETs must increase their transconductance gm while reducing inductance such as grounding inductance, capacitance such as drain capacitance, and floating impedance. FIG. 20 shows a typical equivalent circuit of a high-frequency MOSFET. In the MOSFET of FIG. 18, drain-substrate capacitance, or drain-source capacitance Cds is dependent on a contact area between the drain region 4 and the layer 1b. To drop the drain-substrate capacitance Cds, the prior art reduces the drain area. This prior art, however, is limited by processing techniques and accuracy.

In the MOSFET of SOI structure of FIG. 19, the oxide film 9 is entirely formed through the wafer 1. This may reduce the drain-substrate capacitance Cds but deteriorate heat dissipation radiation. Accordingly, the prior art must provide higher thermal resistance, to deteriorate output power. Unlike the prior art of FIG. 18, the prior art of FIG. 19 is incapable of grounding the source through the bottom surface of the wafer, and therefore, it must bond the grounding wire 11 to the source. This may add a grounding inductance Ls of about 2 nH to the source.

SUMMARY OF THE INVENTION

An object of the present invention is to provide a high-performance semiconductor device that reduces drain capacitance and grounding inductance, thereby realizing high power gains at high frequencies.

Another object of the present invention is to provide a semiconductor device that achieves high-frequency high-output operations without sacrificing substrate's heat dissipation characteristics.

Figure 1:
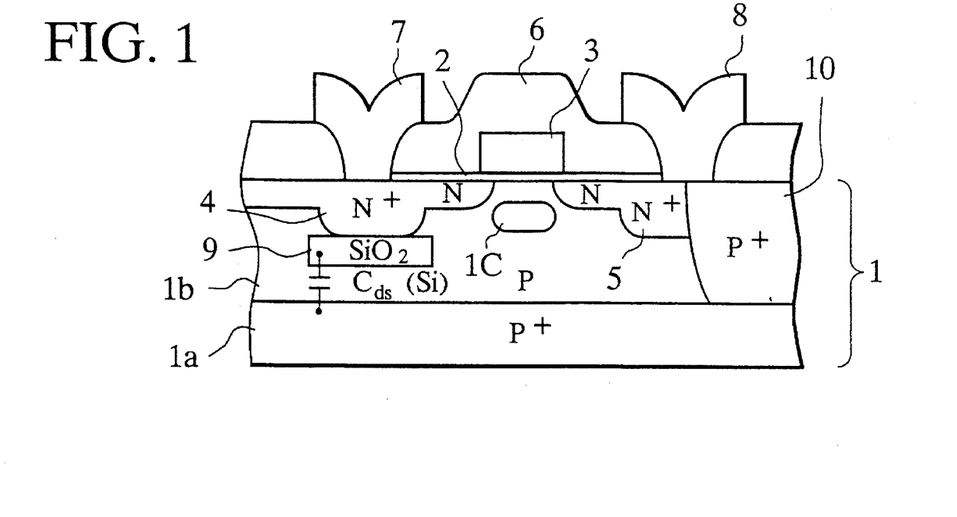
FIG. 1 shows a semiconductor device (an n-channel MOSFET) according to a first embodiment of the present invention.

In order to accomplish the objects, the present invention provides an insulated gate semiconductor device of FIG. 1. This device has a source region 5 serving as a first main electrode region, a drain region 4 serving as a second main electrode region, a channel region serving as a current path between the first and second main electrode regions, and an insulated gate adjacent to the channel region. The device involves a high-impurity-concentration first semiconductor region 1a and a low-impurity-concentration second semiconductor region 1b formed on the first semiconductor region 1a. The source region 5 serving as a fourth semiconductor region and the drain region 4 serving as a fifth semiconductor region are formed along the surface of the second semiconductor region 1b. A highly conductive region (a low-resistance layer) 10 extends from the top surface of the second semiconductor region 1b to the first semiconductor region 1a. In the second semiconductor region 1b except an area for the low-resistance layer 10, there are formed an insulation layer 9 and a high-impurity-concentration region 1C serving as a third semiconductor region adjacent to the channel region. The low-resistance layer 10 forms a current path from the source region 5 (fourth semiconductor region) to the first semiconductor region 1a. This structure eliminates a bonding wire for grounding the source and reduces the floating inductance of the source. Since the impurity concentration of the second semiconductor region 1b is sufficiently low, the peripheries of the drain region 4 (fifth semiconductor region) and source region 5 (fourth semiconductor region) are substantially completely depleted to reduce the junction capacitance of the drain and source. The third semiconductor region, i.e., the high-impurity-concentration region 1C disposed in the vicinity of the channel region acts as a neutral region between the source and the drain, to prevent a punch-through phenomenon. The insulation layer 9 is formed just under the drain region 4, to reduce drain-source capacitance Cds between the drain region 4 and the first semiconductor region 1a. Unlike the conventional SOI structure, the insulation layer 9 is only partly formed not to deteriorate heat flow and dissipation and to provide high output power at high frequencies.

In FIG. 1, the insulation layer 9 is formed only under the drain region 4. The insulation layer 9 may extend under bonding pads of the drain and gate, to reduce parasitic capacitances, or stray capacitances Cdss and Cgss and improve gains at high frequencies. The highly conductive region 10 may be a high-impurity-concentration semiconductor region, or may be made from refractory metal such as W and Mo or silicide such as $WSi_2$, $MoSi_2$, and $TiSi_2$. The region 10 helps ground the source, improves the heat dissipation characteristics of the substrate, and achieves high output power at high frequencies.

Other and further objects and features of this invention will become obvious upon an understanding of the illustra-

DETAILED DESCRIPTION OF THE EMBODIMENTS

Various embodiments of the invention will be described with reference to the accompanying drawings. It must be noted that the same or similar reference numerals are applied to the same or similar parts and elements throughout the drawings, and the description of the same or similar parts and elements will be omitted or simplified.

FIG. 1 is a sectional view showing a semiconductor device according to the first embodiment of the present invention. In the figure, the same parts as those of the prior arts of FIGS. 18 and 19 are represented with like reference numerals. The semiconductor device of FIG. 1 is an n-channel MOSFET. This device has a high-impurity-concentration p+ semiconductor layer (a first semiconductor region) 1a and a low-impurity-concentration p semiconductor layer (a second semiconductor region) 1b formed on the layer 1a. On the layer 1b, there are formed an n+ drain region (a fifth semiconductor region) 4, an n+ source region (a fourth semiconductor region) 5, a channel region serving as a current path between the drain and source regions 4 and 5, a p+ buried region (a third semiconductor region) 1C formed under the channel region, a gate oxide film 2 formed on the channel region, and a gate electrode 3 formed on the gate oxide film 2. A p+ diffused region (a highly conductive region) 10 extends from the surface of the layer 1b to the layer 1a. An oxide film 9 is formed in the layer 1b except an area where the diffused region 10 is present. A source wiring electrode 8 and the source region 5 are electrically connected to the diffused region 10. The bottom of the drain region 4 is in contact with the oxide film 9. To avoid the short channel effect, the drain and source regions 4, 5 have LDD (Lightly Doped Drain) structure: the drain region 4 has a deep high-impurity-concentration n+ contact area and n-type shallow low-impurity concentration extension, and the source region 5 has a deep high-impurity-concentration n+ contact area and n-type shallow low-impurity concentration extension. The shallow extensions face the channel region and are lightly doped compared with the n+ contact areas. The drain and source wiring electrodes 7, 8 contact just on the n+ contact areas of drain and source region 4, 5, respectively. The buried region 1C stops a depletion layer extending from the drain region 4, thereby preventing a punch-through phenomenon to occur between the source and the drain.

Figure 2A:
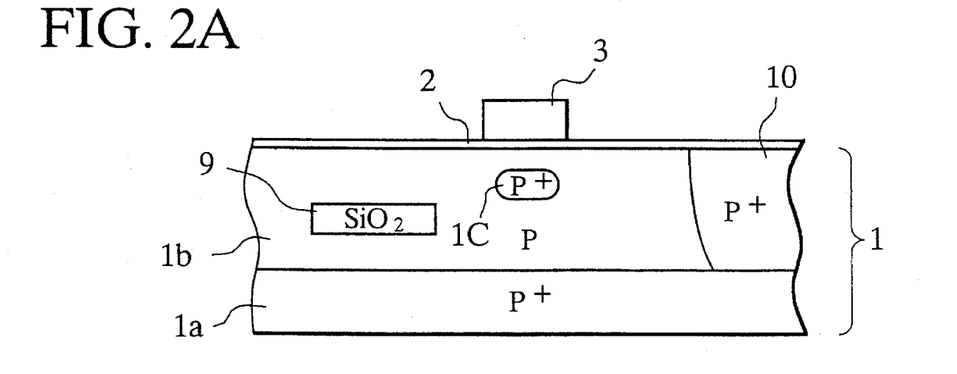
FIGS. 2A and 2B show a method of manufacturing the semiconductor device of the first embodiment.
Figure 2B:
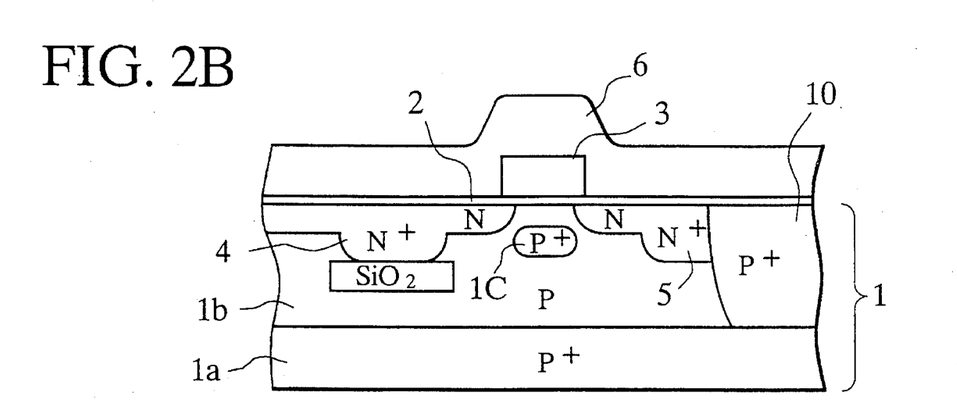

FIGS. 2A and 2B explain a method of manufacturing the semiconductor device of the first embodiment. On a p+ silicon substrate 1a serving as a first semiconductor region, a p epitaxial layer is grown to a thickness of one to three micrometers at an impurity concentration of $1 \times 10^{13}$ to $5 \times 10^{14}$ cm$^{-3}$, to form a p semiconductor layer 1b serving as a second semiconductor region. Ions $^{16}$O+ are implanted into the layer 1b, and an oxide (SiO$_2$) film 9 of 350 to 500 nanometers thick is locally formed inside the layer 1b by SIMOX (Separation by IMplanted OXygen) with a silicon surface layer of 100 to 200 nanometers thick is left on the top surface of the layer 1b. More precisely, the $^{16}$O+ ions are implanted in a dose of $1.8 \times 10^{18}$ cm$^{-2}$ to $2.0 \times 10^{18}$ cm$^{-2}$ at an acceleration voltage of 190 to 200 KeV. A heat treatment is carried out in an argon gas containing 0.54 oxygen at 1325 degrees centigrade for five hours, to form the silicon surface layer of 180 nanometers thick and the oxide film 9 of 450 nanometers thick. Boron ions $^{11}$B+ of $5 \times 10^{15}$ to $4 \times 10^{16}$ cm$^{-2}$ in concentration are implanted into the layer 1b. A heat treatment is carried out to activate and diffuse the boron ions to the layer 1a, to form a highly conductive p+ diffused region 10. A gate oxide film 2 is grown to a thickness of 40 to 120 nanometers. A photoresist mask is employed to implant ions $^{31}$p+ in a dose of $5 \times 10^{15}$ to $2 \times 10^{16}$ cm$^{-2}$ at an acceleration voltage of 80 KeV. The wafer is annealed at 1000 degrees centigrade for about 30 minutes to form contact regions for an n+ source region 5 serving as a fourth semiconductor region and for an n+ drain region 4 serving as a fifth semiconductor region. The photoresist mask is removed by O$_3$ usher. A new photoresist mask is formed to form a p+ buried region 1C. Ions $^{11}$B+ are implanted in a dose of $2 \times 10^{13}$ to $5 \times 10^{14}$ cm$^{-2}$ at an acceleration voltage of 130 to 150 KeV, to form the buried region 1C serving as a third semiconductor region. Highly conductive material such as polycrystalline silicon doped with impurities, refractory metal such as Mo, W, and Ti, MoSi$_2$, WSi$_2$, or TiSi$_2$ is deposited to 350 to 500 nanometers thick. The deposited material is patterned by photolithography and RIE to form a gate electrode 3. The gate electrode 3 is used as a mask to implant n-type impurities such as $^{75}$As+ in a dose of $3 \times 10^{14}$ to $1 \times 10^{15}$ cm$^{-2}$ at an acceleration voltage of 30 KeV, to form, in a self-aligning manner, a shallow extension for each of the source region 5 and drain region 4. An insulation film 6 of PSG, BPSG or SiO$_2$ is entirely deposited to a thickness of 350 to 500 nanometers on the surface of the layer 1b by CVD. Contact holes reaching the source region 5, gate electrode 3, and drain region 4, respectively, are properly formed on the insulation film 6. Al, Al—Si, or Al—Cu—Si is deposited to a thickness of 350 to 1000 nanometers and patterned into a source wiring electrode 8, a drain wiring electrode 7, and a gate wiring electrode (not shown). The present invention is not limited to the LDD structure. If the LDD structure is not employed, the contact areas for the drain and source regions 4 and 5 are formed simultaneously with the shallow extensions by implanting ions $^{75}$As+ in a higher dose of $3\times10^{15}$ cm$^{-2}$.

According to the first embodiment, the p semiconductor layer 1b serving as the second semiconductor region is lightly doped so that the periphery of the n+ drain region 4 is substantially completely depleted to greatly reduce junction capacitance. The oxide film 9 formed under the drain region 4 reduces drain-substrate capacitance, i.e., drain-source capacitance Cgs, thereby increasing power output at high frequencies. The p+ buried region 1C serving as the third semiconductor region leaves a neutral region in the channel, to prevent a punch-through phenomenon to occur between the source and the drain. The p+ diffused region 10 connects the source region 5 to the substrate 1a, so that the source is grounded on the bottom surface of the substrate 1a. This eliminates a source bonding wire, to make source inductance negligible. The diffused region 10 functions as a heat transporting region to realize a high output operation.

Figure 3:
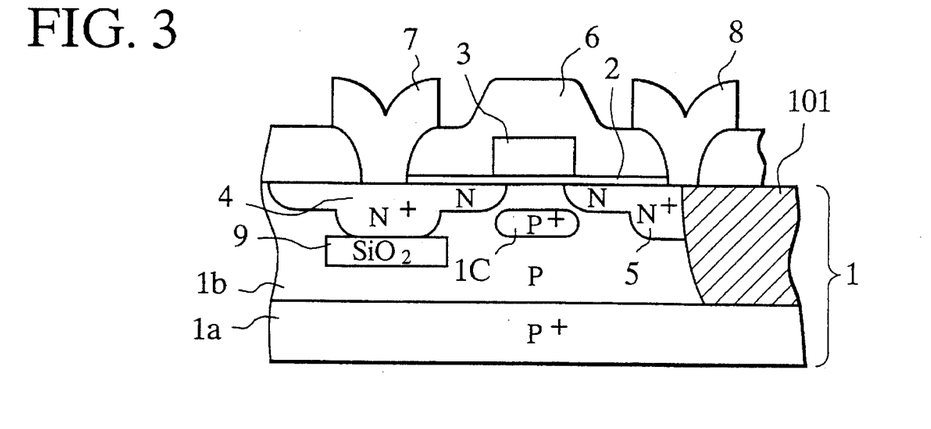
FIGS. 3 to 5 are sectional views showing semiconductor devices (n-channel MOSFETs) according to second, third, and fourth embodiments, respectively, of the present invention.

FIG. 3 is a sectional view showing an n-channel MOSFET according to the second embodiment of the present invention. The second embodiment differs from the first embodiment in that a high-impurity-concentration p+ diffused region 10 is made of highly conductive material 101 such as refractory metal, e.g., W, Mo, Ti, or Co. To prepare the highly conductive material 101, a U groove is formed from the surface of a p semiconductor layer 1b to a p+ substrate 1a by RIE, and W, Ti, or else is selectively grown in the U groove by low-pressure CVD (LPCVD). The highly conductive material 101 may be silicide such as WSi$_2$, MoSi$_2$, TiSi$_2$, or CoSi$_2$. The highly conductive material 101 may be deposited in the U groove by vacuum deposition or spattering. The deposited material is smoothed by lapping. When the U groove is deep, W or WSi$_x$ may be deposited only on the inner wall thereof to form a hollow pipe of W or WSi$_x$. A pipe of the highly conductive material 101 is acceptable if a source region 5 is electrically connected to the substrate 1a through the pipe material 101. Similar to the first embodiment, the second embodiment reduces the capacitance Cgs and source inductance. In addition to this effect, the resistance of the highly conductive material 101 is one tenth the resistance of the diffused region 10, thereby reducing source resistance Rs and further improving high frequency gains. The source resistance Rs is connected to the source in series in an equivalent circuit of FIG. 20. The highly conductive material 101 has high thermal conductivity to improve heat dissipation characteristics.

Figure 4:
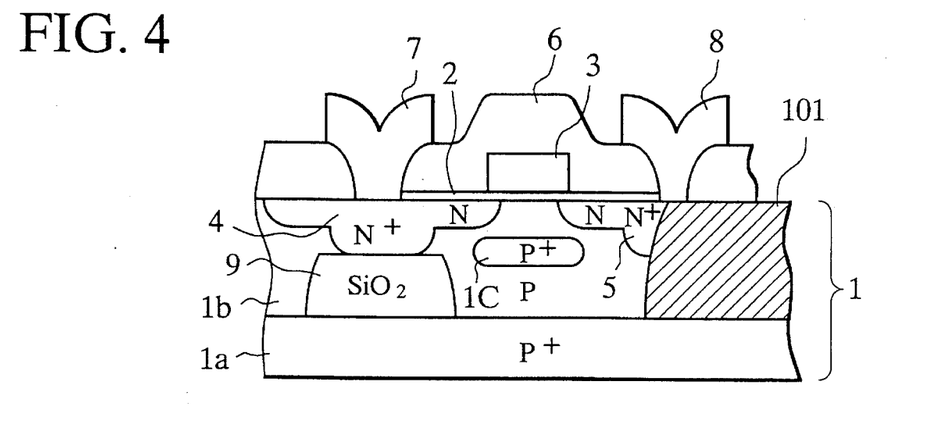

FIG. 4 is a sectional view showing an n-channel MOSFET according to the third embodiment of the present invention. This embodiment differs from the first embodiment in that an oxide film 9 is thick to extend from the bottom of an n+ drain region 4 downward to a p+ substrate 1a. This arrangement further reduces the capacitance Cds. Unlike the manufacturing processes of FIGS. 2A and 2B for the first embodiment, the third embodiment deposits, before epitaxially growing a p semiconductor layer 1b, the SiO$_2$ film 9 by CVD and highly conductive material 101 by spattering or CVD, cutts them by photolithography and RIE, and forms the p semiconductor layer 1b on the SiO$_2$ film 9 and p+ substrate 1a except an area where the highly conductive material 101 is present by epitaxial growth. The structure shown in FIG. 4 may be manufactured by silicon direct bonding (SDB) method. These manufacturing methods will be explained later with reference to FIGS. 6 and 12. The SiO$_2$ film 9 may be formed by SIMOX. This method, however, has some limits in connection with an acceleration voltage for implanting ions $^{16}$O+ and involves damages caused thereby. When the SiO$_2$ film 9 must be thicker than one micrometer, a method of epitaxially growing Silicon on the SiO$_2$ film 9 as shown in FIG. 6 or a method of burying the SiO$_2$ film 9 through the back surface and bonding another separate p+ substrate thereto by SDB as shown in FIG. 12 is preferable.

Figure 5:
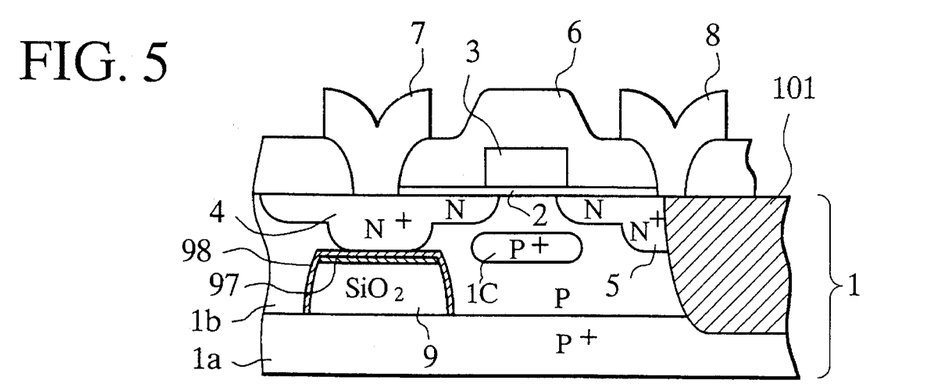

FIG. 5 is a sectional view showing an n-channel MOSFET according to the fourth embodiment of the present invention. This embodiment covers the SiO$_2$ film 9 of the third embodiment with an Si$_3$N$_4$ film 98 and interposes a thin film 97 between the SiO$_2$ film 9 and the Si$_3$N$_4$ film 98. The thin film 97 is made of carbon (C) or zircon (ZrO$_2$.SiO$_2$) having a larger emissivity than SiO$_2$. The Si$_3$N$_4$ film 98 and thin film 97 improve the crystalline characteristics of a p– type semiconductor layer 1b epitaxially grown. It is difficult to epitaxially grow a quality silicon film on the SiO$_2$ film 9 due to oxygen contained in the SiO$_2$ film 9. Accordingly, the embodiment covers the SiO$_2$ film 9 with the Si$_3$N$_4$ film 98 and epitaxially grows silicon on the Si$_3$N$_4$ film 98. More preferably, CaF$_2$ whose lattice constant is close to that of Si is formed on the Si$_3$N$_4$ film 98, to improve the quality of the epitaxially grown layer 1b. The CaF$_2$ may be deposited by vacuum deposition (evaporation). It is possible to omit the Si$_3$N$_4$ film 98 and form only the CaF$_2$ film.

FIGS. 6A to 6D show a method of manufacturing the n-channel MOSFET of the fourth embodiment of FIG. 5.

Figure 6A:
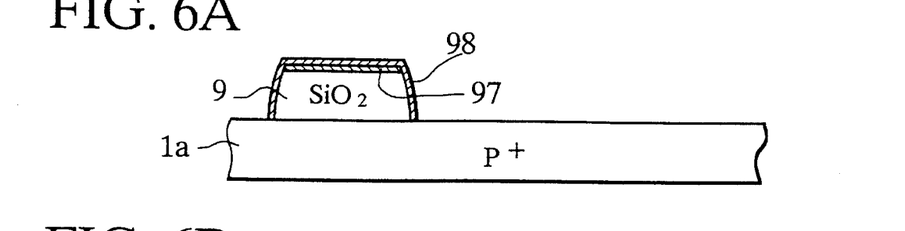
FIGS. 6A to 6D show a method of manufacturing the semiconductor device of the fourth embodiment.

(a) On a p+ substrate 1a of 1 to $2\times10^{18}$ cm$^{-3}$, an oxide film of about 0.8 to 1.0 micrometers thick is formed by thermal oxidization or CVD. The oxide film is etched by photolithography, to define an island of an SiO$_2$ film 9 serving as a buried insulation film at a predetermined position as shown in FIG. 6A. A thin film 97 made of carbon or zircon is deposited to 200 to 300 nanometers thick by vacuum deposition, etc. The thin film 97 is left only on the SiO$_2$ film 9 and the other part thereof is removed by photolithography. To simplify the manufacturing processes, the thin film 97 may be omitted. An Si$_3$N$_4$ film 98 is deposited to 130 to 250 nanometers by CVD. The Si$_3$N$_4$ film is left only on the surface of the SiO$_2$ film 9 and the rest is removed by photolithography.

Figure 6B:
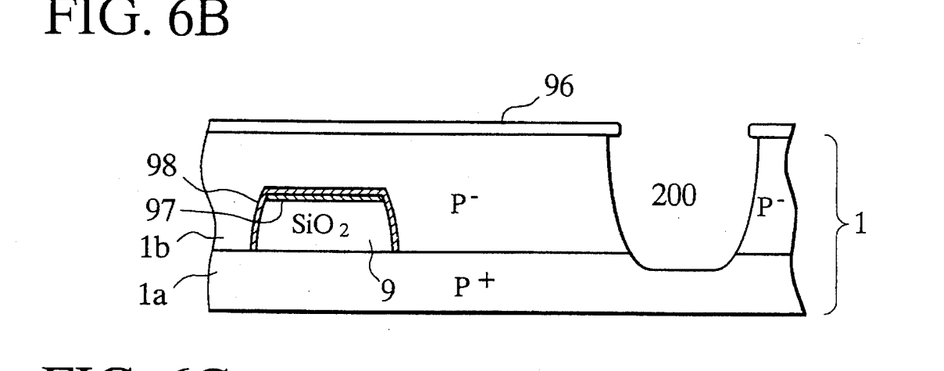

(b) A p semiconductor layer 1b is epitaxially grown in a vapor phase on the substrate 1a on which the SiO$_2$ film 9 has been formed, to bury the island of SiO$_2$ film 9 in the layer 1b. The epitaxial growth is usually carried out with SiH$_2$Cl$_2$, SiHCl$_3$, or SiCl$_4$ and H$_2$. To improve crystalline quality, photo-epitaxy method with ultraviolet rays emitted from an Hg lamp or an excimer laser may be employed. The ultraviolet rays preferably have a short wavelength less than 250 nanometers. The wafer is heated with an infrared lamp to 950 to 1250 degrees centigrade. Since the buried island of insulation film 9 made of SiO$_2$ is covered with the thin film 97 made of carbon or zircon whose emissivity is larger than that of SiO$_2$, the heating infrared rays hardly transmit the buried insulation film 9, to effectively heat the top of the SiO$_2$ film 9. Even if there is no carbon, the top of the SiO$_2$ film 9 is effectively heated because SiO$_2$ itself has greater emissivity than Si. Consequently, the temperature of the top of the SiO$_2$ film 9 becomes higher than that of the other part, to improve the crystalline quality. The layer 1b may be epitaxially grown in two steps. In the first step, a vapor phase epitaxy is carried out to epitaxially grow Si to 300 to 500 nanometers by heat decomposition of $Si_2H_6$, and the grown material is subjected to laser annealing or electron ray annealing. In the second step, a semiconductor layer is epitaxially grown by reduction with $SiH_2Cl_2$ and $H_2$. The laser annealing will effectively heat-treat only the top of the $SiO_2$ film 9 due to the thin film 97, to promote selective recrystallization. The layer 1b is epitaxially grown thicker than a designed value (for example, 2.5 micrometers) by about one micrometer. Thereafter, the layer 1b is flattened by lapping, and the top of the layer 1b is chemically etched to remove mechanical damages due to the lapping and to get a required thickness (for example, 2.5 micrometers). As a result, the thickness of the epitaxially grown layer 1b on the $SiO_2$ film 9 becomes about one micrometer. A thermally oxidized film 96 of 400 to 600 nanometers thick is defined on the surface of the layer 1b. A U groove etching window is defined at a predetermined position on the oxide film 96 by photolithography. The oxide film 96 is used as a mask to form a U groove 200 down to the substrate 1a by RIE with $SF_6/Cl_2$, $SiCl_4$, or $PCl_3$, as shown in FIG. 6B.

Figure 6C:
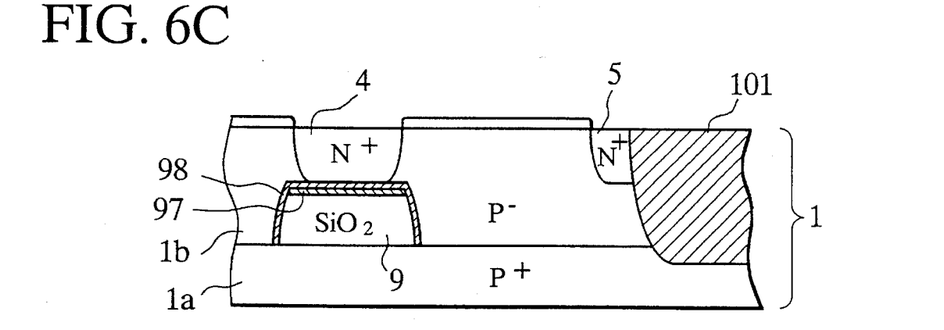
Figure 6D:
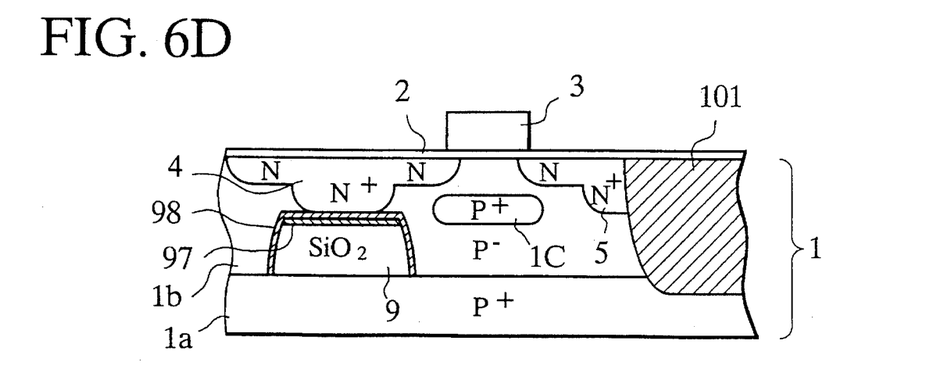
Figure 7:
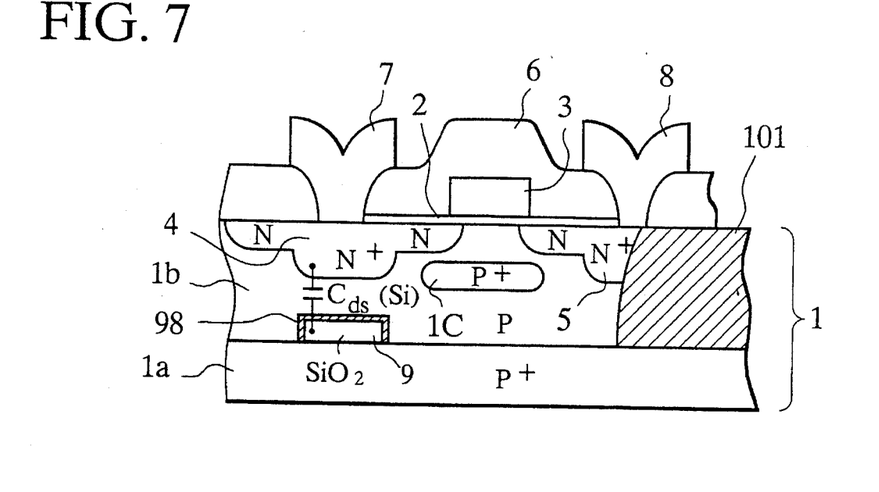
FIGS. 7 to 11 are sectional views showing semiconductor devices (n-channel MOSFETs) according to fifth to ninth embodiments, respectively, of the present invention.

(c) The U groove 200 is selectively filled with W or $WSi_2$ by low-pressure CVD, as shown in FIG. 6C. Diffusion windows are opened on the oxide film 96 by photolithography at positions where source and drain contact regions are to be formed. The source and drain contact regions are formed by thermal diffusion, or by implanting ions $^{75}As+$ and $^{31}p+$ and annealing. In FIG. 6C, the drain contact region is in contact with the $SiO_2$ film 9. The drain contact region is not necessarily in contact with the $SiO_2$ film 9, and the layer 1b may be left between the drain contact region and the $SiO_2$ film 9 as shown in FIG. 7. The depth of each of the source and drain contact regions is about 0.2 to 1.0 micrometers from the surface. The shallower the drain contact region the smaller the capacitance Cds when the thickness of the $SiO_2$ film 9 is constant. Accordingly, it is preferable to make the drain contact region shallow to an extent that causes no penetration of Al, nor Al piping. When the LDD structure is not employed, the source and drain contact regions are not formed in the process of FIG. 6C but simultaneously in the process of FIG. 6D that forms shallow extensions.

(d) A gate oxide film 2 is grown to a thickness of 40 to 100 nanometers. A photoresist mask is formed to implant ions $^{11}B+$ at an acceleration voltage of 200 to 400 KeV, thereby forming a p+ buried region 1C away from the surface of the layer 1b by a distance of 0.5 to 1.0 micrometers. Ions are implanted at about 50 KeV to form a doped channel. A phosphorus doped polycrystalline silicon layer of 350 to 500 nanometers thick is formed by CVD and patterned by photolithography and RIE into a gate electrode 3. The gate electrode 3 is used as a mask to implant ions $^{75}As+$ in a dose of $5\times10^{14}$ to $1\times10^{15}$ cm$^{-2}$ at an acceleration voltage of 35 KeV, to form the shallow extensions of the source and drain regions 5 and 4 in a self-aligning manner. Then, the structure of FIG. 6D is completed. When the LDD structure is not employed, ions $^{75}As+$ or $^{31}p+$ are implanted in a dose of $3\times10^{15}$ to $1\times10^{16}$ cm$^{-2}$ at an acceleration voltage of 50 to 80 KeV. Similar to the processes of FIGS. 2A and 2B, $SiO_2$ is entirely deposited to a thickness of 200 nanometers, and then, PSG to a thickness of 150 nanometers. Contact holes are opened, and metallization with Al and Al—Si is carried out to form a source wiring electrode 8, a drain wiring electrode 7, and a gate wiring electrode, thereby completing the n-channel MOSFET of FIG. 5.

FIG. 7 is a sectional view showing an n-channel MOSFET according to the fifth embodiment of the present invention. An $SiO_2$ film 9 is adjacent to a p+ substrate 1a. A p-type semiconductor layer 1b is present between the $SiO_2$ film 9 and an n+ drain region 4. The impurity concentration and thickness of the layer 1b are determined such that the layer 1b is completely depleted due to an electric field of the drain region 4. In consideration of the quality of the layer 1b epitaxially grown, the $SiO_2$ film 9 is covered with an $Si_3N_4$ film 98. Instead of the $Si_3N_4$ film 98, a thin film made of, for example, $CaF_2$ whose lattice constant is close to that of Si is employable. In the structure of FIG. 1, an area under the $SiO_2$ film 9 is hardly depleted and forms a thin depleted layer under the $SiO_2$ film 9. The capacitance Cds of the depleted layer is connected with the capacitance Cds of the $SiO_2$ film 9 in series. As a result, total capacitance Cds will not be decreased in the structure of FIG. 1. On the other hand, the fifth embodiment reduces the capacitance Cds(Si), to realize a high-frequency operation. When the $SiO_2$ film 9 is thick as shown in FIG. 4, the quality of the epitaxial layer 1b may deteriorate to cause trouble in the channel. Since the $SiO_2$ film 9 of FIG. 5 is thin to relatively increase the thickness of the epitaxial layer 1b, it improves the crystalline qualities, mobility, and transconductance gm of the channel. The $SiO_2$ film 9 may be buried in the p+ substrate 1a as shown in FIG. 8.

Figure 8:
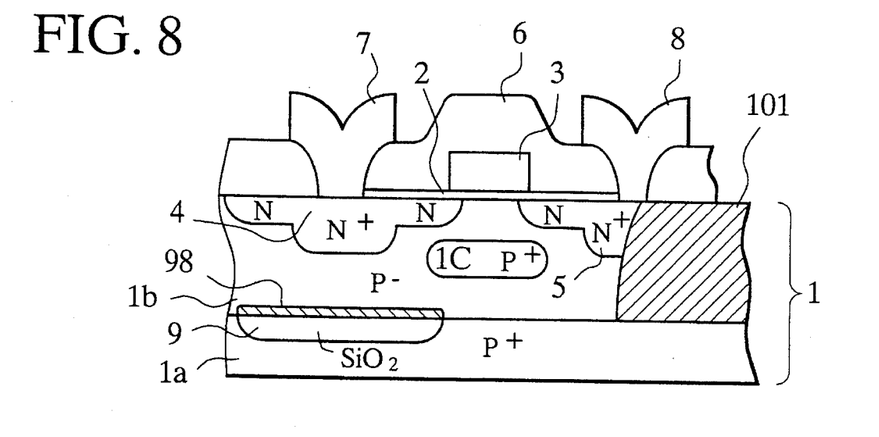

FIG. 8 is a sectional view showing an n-channel MOSFET according to the sixth embodiment of the present invention. A p semiconductor layer 1b has a low impurity concentration of $10^{13}$ to $5\times10^{14}$ cm$^{-3}$. Similar to the first to fifth embodiments, the periphery of a drain region 4 of the sixth embodiment is completely depleted to lower the junction capacitance of the drain. Similar to the embodiment of FIG. 6, a p+ buried region 1C under a channel is formed by ion implantation, to prevent a punch-through effect between a source and the drain. As explained with reference to FIG. 6, an $SiO_2$ film 9 may be formed by thermal oxidization to provide the film with high quality. Similar to the embodiments of FIGS. 5 to 7, the $SiO_2$ film 9 is covered with an $Si_3N_4$ film 98 to improve the crystalline quality of the layer 1b. According to the sixth embodiment, the layer 1b is thicker than those of the other embodiments, to further improve the crystalline quality of the layer 1b. Accordingly, the sixth embodiment may omit the $Si_3N_4$ film 98. To further improve the crystalline quality of the layer 1b, a film of $CaF_2$ or $Ge/Ca_{0.44}Sr_{0.56}F_2$ whose lattice constant is close to that of Si may be formed on or instead of the $Si_3N_4$ film 98 by vacuum deposition evaporation or MBE. This results in compensating the mismatching between the lattice constant of $SiO_2$ and Si.

Figure 9:
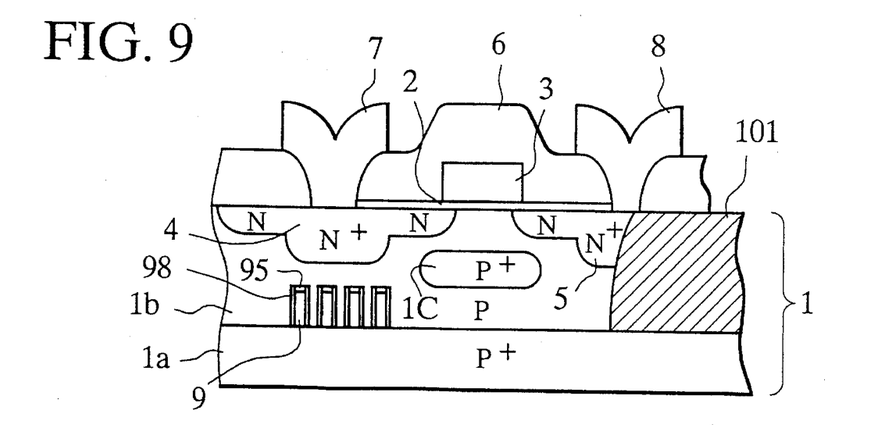

FIG. 9 is a sectional view showing a semiconductor device according to the seventh embodiment of the present invention. This embodiment divides a buried insulation layer into blocks to improve the crystalline quality of an epitaxially grown layer. Each of the blocks includes an $SiO_2$ film 9 as a main core, material 95 that is formed on the $SiO_2$ film 9 and has lattice constant similar to that of Si, and an $Si_3N_4$ film 98 formed on sidewalls of the $SiO_2$ film 9. The blocks extend orthogonal to the plane of the figure, to form stripes. They may be further divided in the orthogonal direction into square blocks arranged in an X-Y matrix on a p+ substrate 1a. To form the divided insulation films 9, 95, and 98, an $SiO_2$ film of 0.8 to 1.0 micrometers thick is formed by CVD, a $CaF_2$ film of 200 to 300 nanometers thick is formed by vacuum deposition, and the films are divided into stripes by photolithography and ECR ion etching. Thereafter $Si_3N_4$ films are deposited on the $SiO_2/CaF_2$ films, and then etched to leave only $Si_3N_4$ films on the sidewalls of the diveded stripes. This embodiment grows a p silicon layer 1b on the substrate 1a between the divided insulation layers 9, 95, and 98 and forms bridges over the divided insulation layers 9, 95, and 98. The layer 1b selectively epitaxially grows on the divided insulation layers, to improve the crystalline quality of the layer 1b as if there are no insulation layers. Although this embodiment is unadvantageous in reducing the capacitance Cds, it improves the crystalline qualtity and mobility, thereby improving transconductance gm and high frequency gains.

Figure 10:
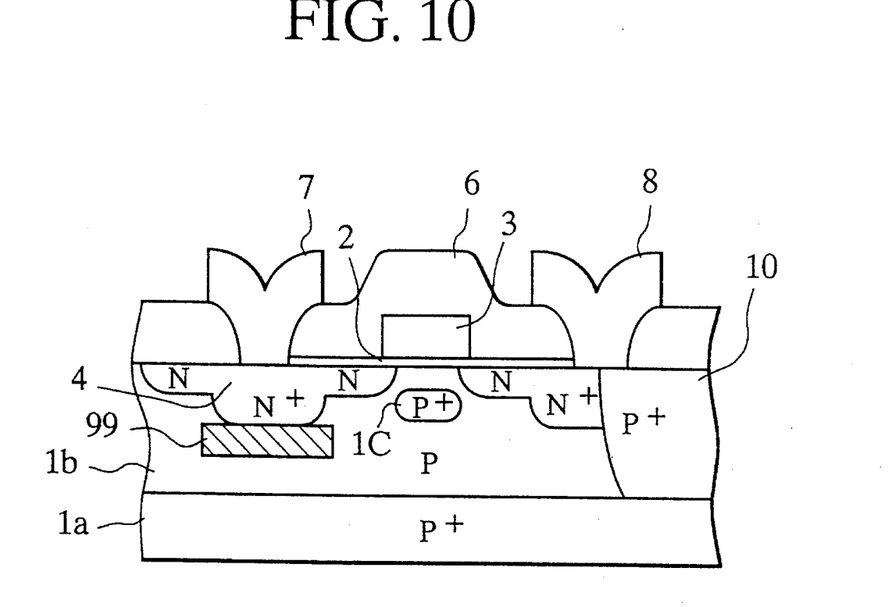
Figure 11:
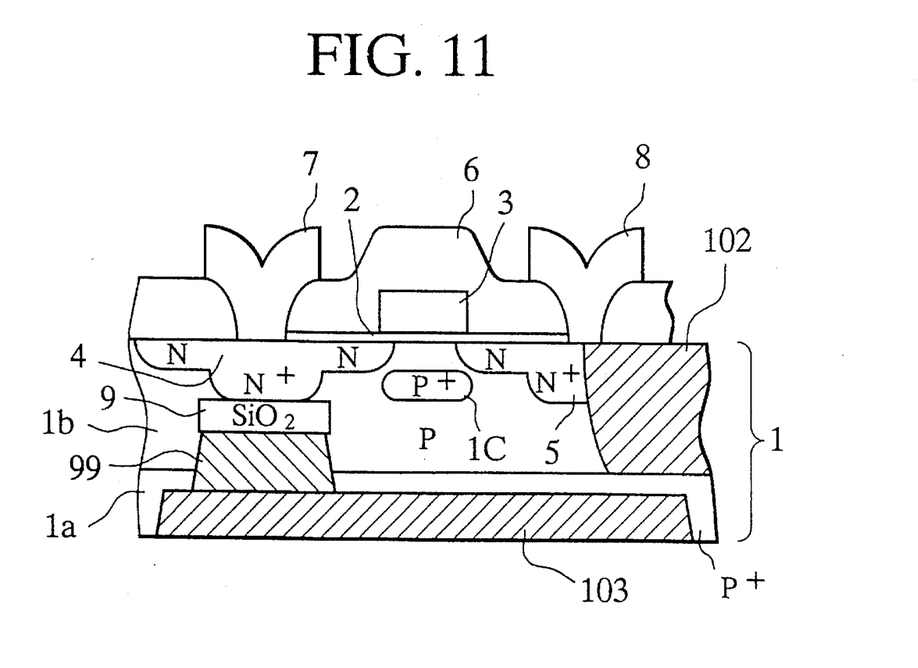

FIG. 10 is a sectional view showing a semiconductor device according to the eighth embodiment of the present invention. This is also an n-channel MOSFET. This embodiment differs from the first embodiment in that an insulation film 99 corresponding to the oxide film 9 is made of $Si_3N_4$ or $Al_2O_3$ instead of $SiO_2$. The $Si_3N_4$ film or $Al_2O_3$ film has a larger dielectric constant than the oxide film, so that it is not always preferable in terms of reducing capacitance. In this case, similar to the SIMOX, ions such as $^{16}O+$ and $^{12}C+$ may be simulatneously implanted to form the film 99 whose dielectric constant is smaller than that of the oxide film 9 ($SiO_2$=3.9). This results in further reducing the drain capacitance. To reduce the dielectric constant, air will be preferable as the insulation material. Namely, a hollow, or an air bridge will be made instead of the insulation film 99. The hollow structure, however, might be difficult to manufacture. This is the reason why the structure of FIG. 11 is proposed. If the hollow structure must be prepared, an SDB method of FIG. 12 is effective.

FIG. 11 is a sectional view showing an n-channel MOSFET according to the ninth embodiment of the present invention. The bottom surface of a p+ substrate 1a is etched and removed by about 100 to 300 micrometers toward a p semiconductor layer 1b. The etched part is filled with conductive material 103. The conductive material 103 may be Ni, Cu, or Au that is plated on the etched part to a thickness of 100 to 300 micrometers. To maintain mechanical strength, the periphery of the substrate 1a is left as it is at a thickness of 250 to 350 micrometers. Only the area just under a device active region of the substrate 1a is thinned. This structure further reduces the source resistance Rs of FIG. 20. In addition, this structure achieves good heat dissipation and realizes high-frequency high-output operations. The substrate 1a may be etched up to the epitaxial layer 1b. In this case, the conductive material 103 directly gets in contact with conductive material 102. The ninth embodiment shown in FIG. 11 forms a second groove upward from the etched part filled with conductive material 103 to the bottom of an $SiO_2$ film 9 and fills the second groove with resin 99. The resin 99 may be trifluoroethylene, tetraphloroethylene, or polyimide whose dielectric constant is smaller than $SiO_2$. The second groove may be a hollow or an air cavity as it is. It is preferable, however, to fill the second groove, to easily form the conductive material 103. If the second groove must be hollow, the SDB method of FIG. 12 is employed. According to the ninth embodiment of FIG. 11, material whose dielectric constant is lower than $SiO_2$ is buried under a drain region, to greatly reduce the capacitance Cds.

Making a hollow in the p semiconductor layer 1b has been mentioned with reference to FIGS. 4, 10, and 11. FIGS. 12A to 12D are sectional views showing a method of manufacturing a MOSFET according to the 10th embodiment of the present invention having the hollow formed by silicon direct bonding (SDB). The epitaxial growth method of FIG. 6 or FIG. 11 is appropriate when the p semiconductor layer 1b is thin, for example, 30 micrometers or less for a high-frequency operation. When the device is a power MOSFET of high power, the layer 1b must be thick to 50 to 350 micrometers. In this case, it is preferable to employ a p silicon wafer 1 having a resistivity of 20 to 1000 ohms centimeter grown by FZ method, with a p+ diffused layer 1a having an impurity concentration of $5\times10^{18}$ to $3\times10^{19}$ cm$^{-3}$ being formed on the bottom surface of the wafer 1 to a depth of about 10 to 30 micrometers.

Figure 12A:
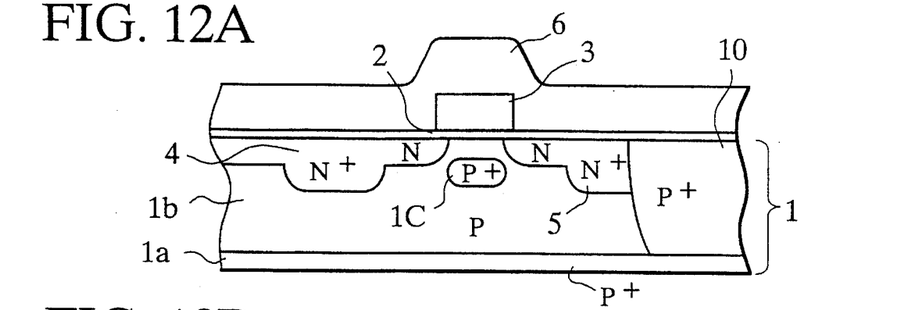
FIGS. 12A to 12D show a method of manufacturing a semiconductor device (an n-channel MOSFET) according to a 10th embodiment of the present invention.

(a) In the p silicon wafer 1 having a thickness of 50 to 350 micrometers, a third semiconductor region 1C, a source region 5, and a drain region 4 are formed. A p+ diffused region 10 reaching the p+ diffused layer 1a is formed by heat treatment. Instead of the diffused region 10, a U groove explained with reference to FIG. 3 may be formed, and W or $WSi_x$ may be deposited along the surface of the U groove to form the highly conductive pipe. A gate oxide film 2 is grown to a thickness of 40 to 120 nanometers. A photoresist mask is prepared, and ions $^{31}$p+ are implanted in a dose of $5\times10^{15}$ to $2\times10^{16}$ cm$^{-2}$ at an acceleration voltage of 80 KeV. The wafer is annealed at 1000 degrees centigrade for about 30 minutes, to form contact regions for the source region 5 serving as a fourth semiconductor region and the drain region 4 serving as a fifth semiconductor region. The photoresist mask is removed by $O_3$ usher. A new photoresist mask for the p+ buried region 1C is prepared, and ions $^{11}$B+ are implanted in a dose of $2\times10^{13}$ to $5\times10^{14}$ cm$^{-2}$ at an acceleration voltage of 130 to 150 KeV, to form the p+ buried region 1C serving as a third semiconductor region. Highly conductive material such as impurity-doped polycrystalline silicon, refractory metal such as Mo, W, and Ti, a film of silicide such as $MoSi_x$, or a film of polycide is deposited to a thickness of 350 to 500 nanometers. The deposited highly conductive material is patterned by photolithography and RIE into a gate electrode 3. The gate electrode 3 is used as a mask to implant n-type impurity ions such as $^{75}$As+ in a dose of $3\times10^{14}$ to $1\times10^{15}$ cm$^{-2}$ at an acceleration voltage of 30 KeV, to thereby form shallow extensions of the source and drain regions 5 and 4 in a self-aligning manner. An insulation film 6 made of PSG, BPSG or $SiO_2$ is entirely deposited on the surface of the layer 1b to a thickness of 350 to 500 nanometers by CVD.

Figure 12B:
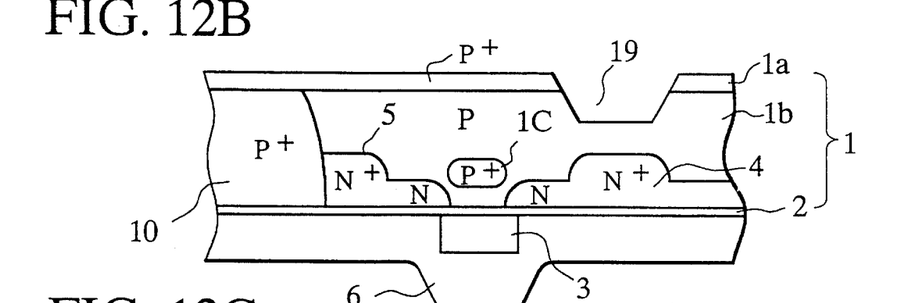

(b) The silicon wafer 1 is turned upside down, and a groove 19 is formed on the bottom surface of the wafer 1 by etching as shown in FIG. 12B. A double sided mask aligner is employed to etch a location under the drain region 4 by wet or dry etching. The surface of the diffused layer 1a is polished into a mirror surface. A p+ semiconductor chip 11 is prepared to be used in the process of FIG. 12C, and the surface of the chip 11 is polished into a mirror surface.

Figure 12C:
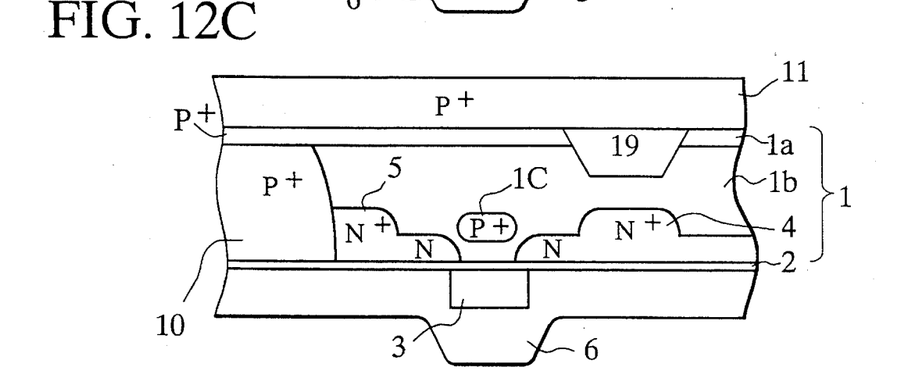

(c) The mirror surfaces are bonded to each other and heat-treated according to the SDB technique as shown in FIG. 12C. Before the heat treatment, a voltage may be applied to the bonded junction. The SDB provides a good bonded junction having an interface level of $5\times10^{10}$ cm$^{-2}$.

Figure 12D:
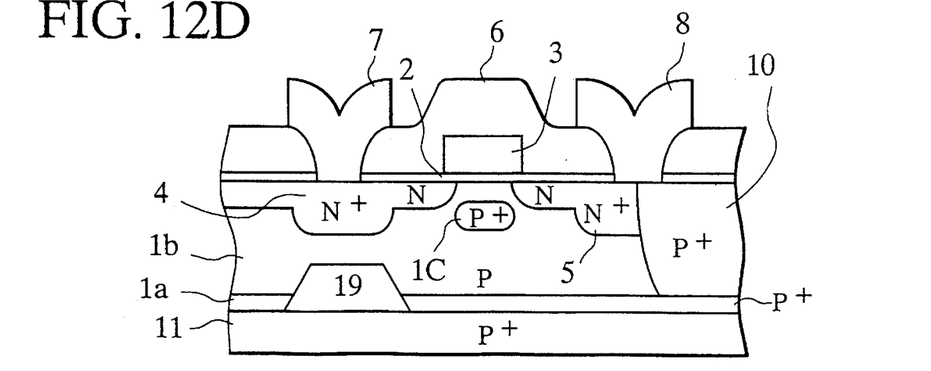

(d) The SDB wafer is again turned upside down so that the p semiconductor layer 1b comes on top. In FIG. 12D, contact holes reaching the source region 5, gate electrode 3, and drain region 4 are formed in the insulation film 6 at proper positions. Al, Al—Si, or Al—Cu—Si is vacuum deposited to a thickness of 350 to 1000 nanometers. The deposited metal is patterned into a source wiring electrode 8, a drain wiring electrode 7, and a gate wiring electrode (not shown).

When the LDD structure is not employed, the contact areas for the drain and source regions 4 and 5 will be formed simultaneously with shallow extensions by implanting ions $^{75}$As+ in a larger dose of $3\times10^{15}$ cm$^{-2}$. In FIG. 12B, the groove 19 may be formed up to the drain region 4, to further reduce the capacitance Cds. It is preferable to form the groove 19 under gate and drain bonding pads except the area where the highly conductive region 10 is formed. The 10th embodiment of the present invention is also applicable to high-frequency FETs. In this case, the silicon wafer 1 of FIG. 12A is composed of, similar to FIG. 2A, a p+ substrate 1a and a p semiconductor layer 1b epitaxially grown on the substrate 1a.

Figure 13:
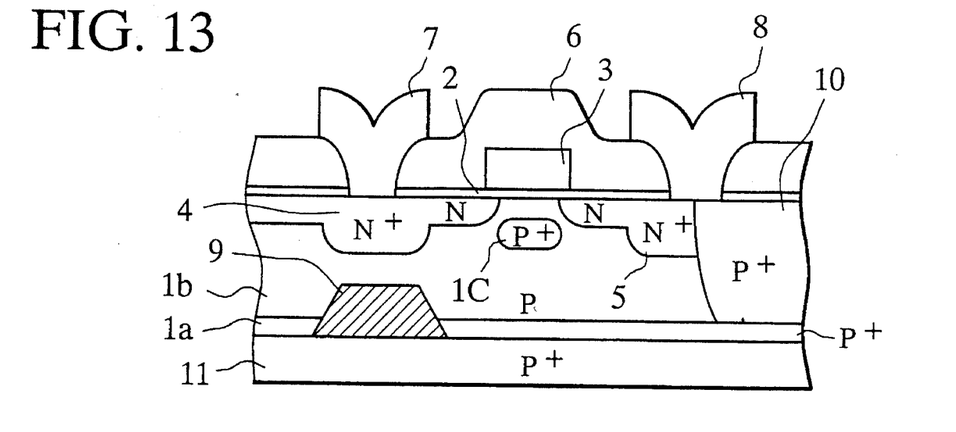
FIGS. 13 and 14 are sectional views showing the semiconductor device of the 10th embodiment.
Figure 14:
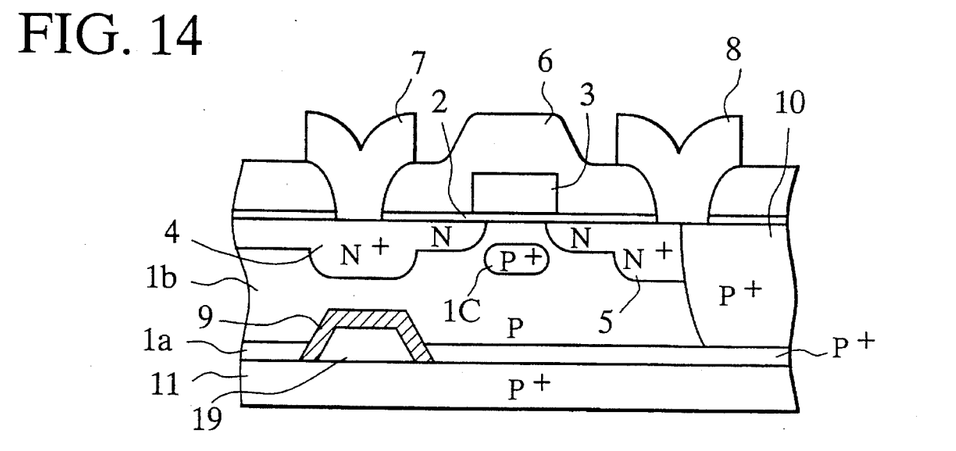

FIGS. 13 and 14 are sectional views showing MOSFETs according to modifications of the 10th embodiment of FIG. 12 employing the SDB technique. In FIG. 12D, the groove 19 is a hollow. In practice, the SDB technique of FIG. 12C is carried out in an inert gas such as $N_2$, Ar, or He, so that the hollow is filled with the inert gas. The dielectric constant of the hollow is about 1 which is very low compared with the dielectric constant of 3.9 of an oxide film ($SiO_2$). To maintain mechanical strength and stability on the surface of the groove 19, FIG. 13 fills the groove 19 with an $SiO_2$ film 9. This $SiO_2$ film 9 is formed by thermal oxidization or CVD. More precisely, $SiO_2$ is entirely formed in the last stage of FIG. 12B and polished into a mirror surface, to expose the p+ diffusion layer 1a. Instead, the groove 19 may be filled with $SiO_2$ containing B, i.e., Si—B—O particles serving as adhesive during the SDB process. In FIG. 13, the groove 19 may be formed up to an n+ drain region 4, to provide the same structure as FIG. 4.

FIG. 14 forms a thin oxide film 9 of 200 to 400 nanometers thick along the surface of the groove 19, to leave a hollow or an air bridge in the center of the groove 19. The hollow is filled with an inert gas. More precisely, a thin $SiO_2$ film is formed by thermal oxidization in the last stage of FIG. 12B. The film is mirror-polished until the p+ diffusion layer 1a is exposed.

Figure 15:
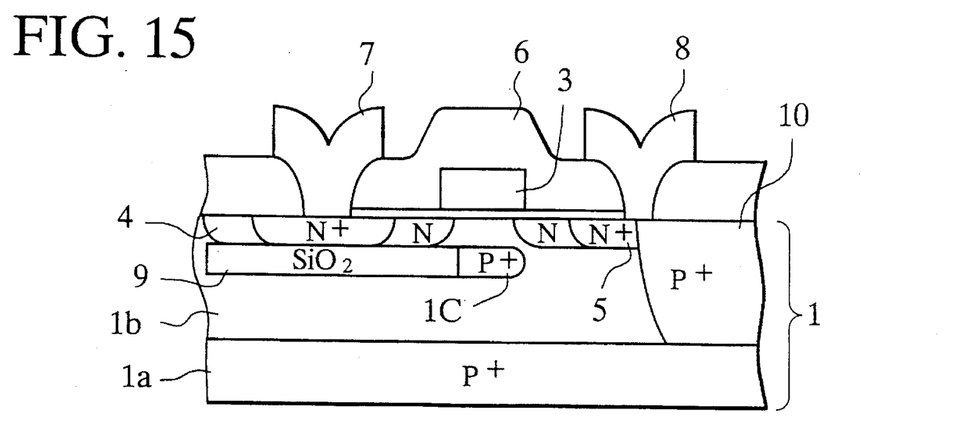
FIG. 15 is a sectional view showing a semiconductor device (an n-channel MOSFET) according to an 11th embodiment of the present invention.

FIG. 15 is a sectional view showing a semiconductor device according to the 11th embodiment of the present invention. This device is an n-channel MOSFET, which is different from the first embodiment in that an n+ semiconductor layer (a contact area) for an n-type drain region 4 and an n-type semiconductor layer (an extension) thereof in an LDD structure have the same diffusion depth. The bottoms of the contact area and extension are in contact with an oxide film 9, to further reduce the drain capacitance Cds.

The advantages and effects of the semiconductor device according to the present invention will be explained with reference to experimental data. The drain capacitance of the conventional MOSFET of FIG. 18 is 1.01 pF, while the first embodiment provides 0.506 pF that is 50.1% of the prior art and the 11th embodiment provides 0.305 pF that is 30.2% of the prior art because the first, and 11th embodiments of the present invention employ the oxide film 9 under the n+ drain region 4.

The present invention forms no insulation layer under the n+ source region S. Instead, the present invention forms the p+ diffused region 10 or the highly conductive material 101. The top of the region 10 or material 101 is in contact with the n+ source region 5 and source wiring electrode 8 while the bottom thereof is in contact with the p+ semiconductor layer 1a of the p silicon wafer 1. This structure enables the source to be grounded through the bottom surface of the device, to thereby reduce the grounding inductance Ls. For example, the prior art of FIG. 19 has a grounding inductance of about 2 nH due to the grounding wire 11 bonded. The first to 11th embodiments reduce the grounding inductance to 0.023 nH that is 1.15% of the prior art.

Figure 16:
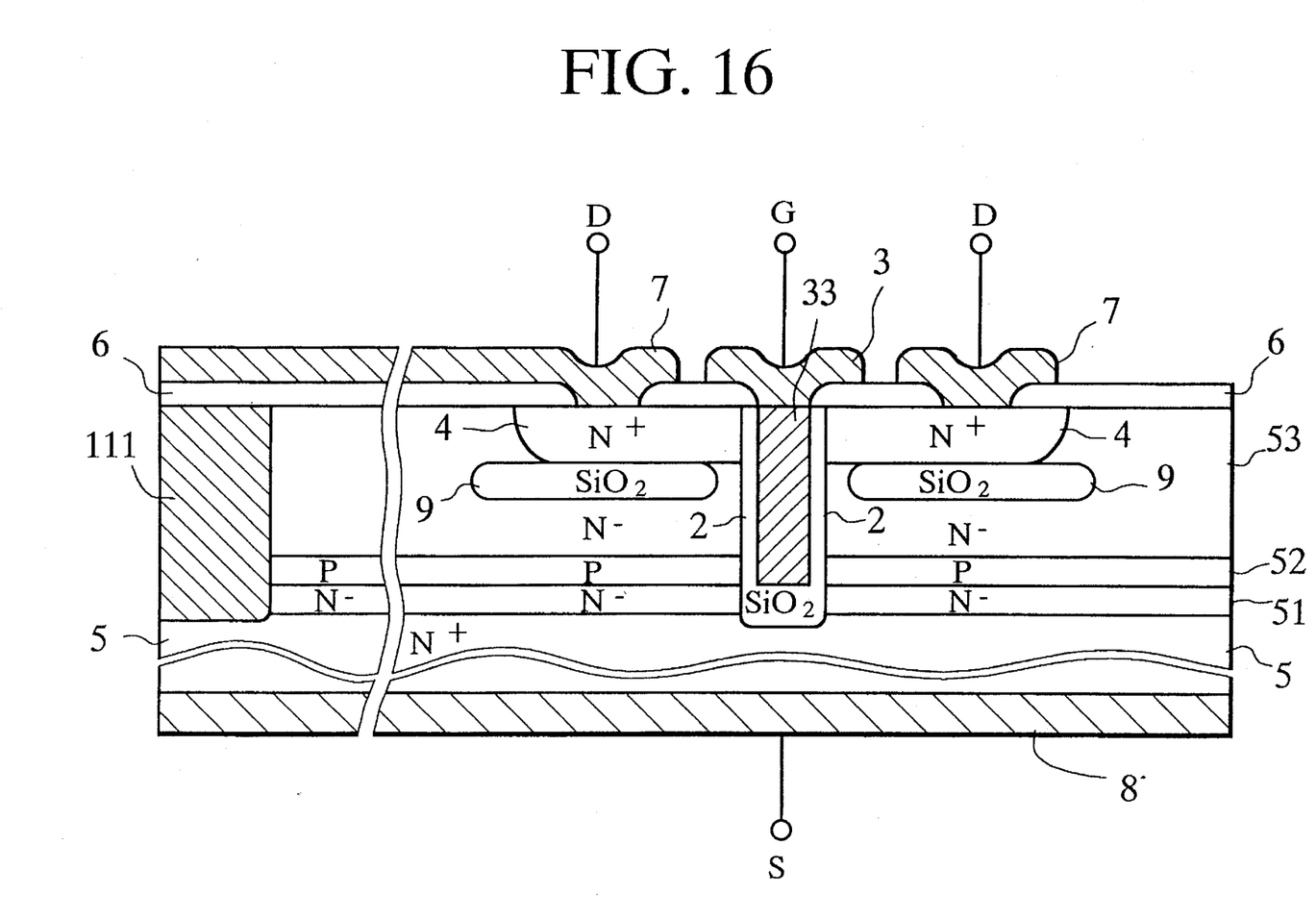
FIG. 16 is a sectional view showing a semiconductor device (an n-channel UMOSFET) according to a 12th embodiment of the present invention.

The semiconductor devices according to the present invention greatly improve power gains as follows:

prior art of FIG. 18: 20 dB
prior art of FIG. 19: 21 dB
first embodiment: 23 dB
11th embodiment: 25.2 dB Although the present invention has been explained with reference to the planar MOSFETs, or the lateral MOSFETs, the present invention is applicable to vertical insulated gate transistors such as UMOSFETs. FIG. 16 is a sectional view showing an n− channel UMOSFET according to the 12th embodiment of the present invention. In FIG. 16, an n+ substrate (a first semiconductor region) serves as a source region 5. On the source region 5, there are continuously epitaxially formed an n− epitaxial layer 51 serving as a fifth semiconductor region, a p base layer 52 serving as a second semiconductor region, and an n− drift region 53 serving as a third semiconductor region. On the surface of the drift region 53, an n+ region is formed as a drain region 4 serving as a fourth semiconductor region. A U groove is formed from the top surface of the n-drift region 53 down to the source region 5. A gate oxide film 2 is formed along the surface of the U groove. A buried gate electrode 33 is formed from polysilicon inside the U groove. A channel is formed along the sidewall of the U groove. The n− epitaxial layer 51 reduces gate-source capacitance Dgs and may be omitted depending on requirements. A metal source electrode 8 is formed on the bottom surface of the substrate. A metal drain electrode 7 is formed on the drain region 4. Another U groove is formed on the top surface and filled with highly conductive material 111, to electrically connect the p base region 52 with the n+ source region 5. This structure prevents the base region 52 from electrically floating and improves heat transport characteristics. Similar to the first embodiment, an $SiO_2$ film 9 is formed under the drain region 4 by SIMOX, to reduce the capacitance Cds. Since the source electrode is formed on the bottom surface of the n+ substrate, source grounding inductance is substantially negligible. The $SiO_2$ film 9 is not entirely formed. This improves heat dissipation characteristics. Accordingly, this embodiment provides high gains and high output at high frequencies.

Figure 17:
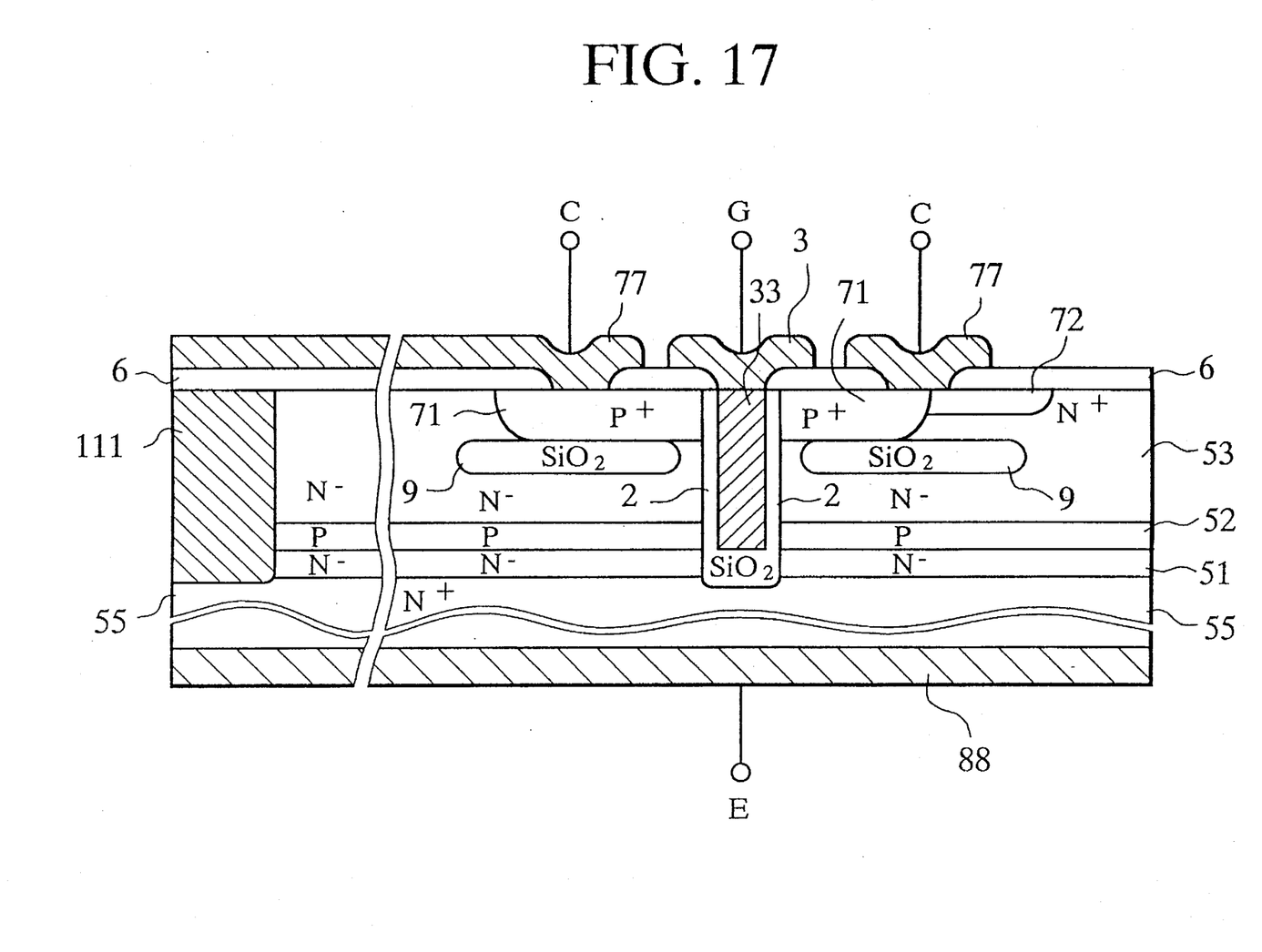
FIG. 17 is a sectional view showing a semiconductor device (an n-channel IGBT) according to a 13th embodiment of the present invention.

The present invention is applicable not only to MOSFETs but also to other semiconductor devices. FIG. 17 is a sectional view showing a vertical IGBT according to the 13th embodiment of the present invention. On an n+ emitter region 55 serving as a first semiconductor region, there are formed a low-impurity-concentration n− region 51 serving as a fifth semiconductor region, a p base layer 52 serving as a second semiconductor region, and an n− drift region 53 serving as a third semiconductor region. Similar to FIG. 16, the n− region 51 may be omitted. On the n− drift region 53, there are formed a p+ collector region 71 serving as a fourth semiconductor region and an n+ short region 72 serving as a sixth semiconductor region. A U groove is formed from the surface of the drift region 53 to the emitter region 55. A thick oxide film is formed on the bottom of the U groove, and a thin gate oxide film 2 is formed along the sidewall of the U groove.

A buried gate electrode 33 is formed from, for example, polysilicon on the surface of the p base region 52 with the thin gate oxide film 2 such as an $SiO_2$ film interposing between them. The n+ short region 72 is short-circuited to the collector region 71 through a metal collector electrode 77. A metal emitter electrode 88 is connected to the emitter region 55.

A principle operation of the IGBT according to the 11th embodiment will be explained. The IGBT is turned ON when the metal emitter electrode 88 is grounded, a positive voltage is applied to the metal collector electrode 77, and a positive voltage is applied to the metal gate electrode 3 with respect to the metal emitter electrode 88. When the positive voltage is applied to the metal gate electrode 3, an inverted channel is formed along the sidewall of the p base region 53, similar to a MOSFET. As a result, electrons are injected from the emitter region 55 into the drift region 53 through the inverted channel. On the other hand, holes are injected from the collector region 71 into the drift region 53, so that a pn junction between the collector region 71 and the drift region 53 is put in a forward bias state. As a result, the drift region 53 causes conductance modulation to make the device conductive. While the IGBT is ON, the drift region 53, which has originally high resistance, drops its resistance due to the conductance modulation. Accordingly, even if the device achieves a high breakdown voltage with the thick n– drift region 53 of low impurity concentration, the device will involve very small ON resistance. The IGBT is turned OFF when a negative voltage is applied to the gate electrode 3 with respect to the emitter electrode 88. When the negative voltage is applied to the gate electrode 3, the inverted channel disappears, so that electrons from the emitter region 55 stop. At this time, the drift region 53 still holds electrons. Holes accumulated in the drift region 53 mostly flow to the emitter region 55 through the base region 52 and partly recombine with the electrons in the drift region 53 and disappear. The electrons in the drift region 53 partly flow into the collector electrode 77 through the n+ short region 72. When the holes and electrons accumulated in the drift region 53 completely disappear, the device is turned OFF. If some delay, or tail current is acceptable in turning OFF the device, the short circuit region 72 may be omitted.

In FIG. 17, the $SiO_2$ film 9 is formed under the collector region 71, to reduce the collector-emitter capacitance and realize a high-frequency operation. The $SiO_2$ film 9 is formed by SIMOX or by epitaxially growth burying $SiO_2$. To epitaxially grow and bury $SiO_2$, the drift region 53 is epitaxially grown and stopped, and an $SiO_2$ layer is formed, and then the drift region 53 is again epitaxially grown on the $SiO_2$ layer 9. In this case, a $CaF_2$ film may be formed on the $SiO_2$ layer 9, to match the lattice constant of silicon. The impurity concentration and thickness of the p base region 52 are determined such that a neutral region is left in the channel and no punch-through phenomenon occurs between the source and the drain regions. Conductive material ill connecting the base region 52 to the emitter region 55 helps to convey heat, to achieve a high-output operation. Although the semiconductor devices of the above embodiments have been of n-channel type, they may be of p– channel type. The present invention is also applicable to CMOS devices. The present invention is not limited to silicon devices. The present invention is applicable to SiC power MOS devices that provide high output at high frequencies even under 600 degrees centigrade or above. The present invention is also applicable to other types of insulated gate semiconductor devices including those employing a GaAs—GaAlAs heterojunction such as HEMTs (High Electron Mobility Transistors) and GaAs HIGFETs (Heterostructure Insulated Gate FETs) and MOS semiconductors employing an $SiO_2$ film formed on the surface of InP.

Various modifications will become possible for those skilled in the art after receiving the teachings of the present disclosure without departing from the scope thereof.

What is claimed is:

1. A semiconductor device having an insulated gate, first and second main electrodes, and a channel region between the first and second main electrodes, said semiconductor device comprising:

(a) a high-impurity-concentration first semiconductor region of a first conductivity type;

(b) a second semiconductor region of said first conductivity type formed on said first semiconductor region, the impurity concentration of said second semiconductor region being lower than that of said first semiconductor region;

(c) a third semiconductor region of said first conductivity type formed in said second semiconductor region adjacent to the channel region, the impurity concentration of said third semiconductor region being higher than that of said second semiconductor region;

(d) high-impurity-concentration fourth and fifth semiconductor regions of a second conductivity type formed at the upper surface and in said second semiconductor region and serving as the first and second main electrode regions, respectively;

(e) a highly conductive region formed in said second semiconductor region, for connecting said first and fourth semiconductor regions with each other; and (f) an insulation layer locally formed under said fifth semiconductor region, wherein said first semiconductor region serves as an auxiliary first main electrode connected to an outer circuit.

2. A semiconductor device according to claim 1, wherein said insulation layer is in contact with said fifth semiconductor region.

3. A semiconductor device according to claim 1, wherein said insulation layer is in contact with said first semiconductor region.

4. A semiconductor device according to claim 3, wherein said insulation layer is made of silicon oxide.

5. A semiconductor device according to claim 4, further comprising:

a silicon nitride film for covering said silicon oxide layer except an area that is in contact with said first semiconductor region.

6. A semiconductor device according to claim 5, wherein said insulation layer is made of material whose dielectric constant is smaller than that of $SiO_2$.

7. A semiconductor device according to claim 3, wherein said insulation layer is made of one of $SiO_2$, $Si_3N_4$, and $Al_2O_3$.

8. A semiconductor device according to claim 1, wherein said insulation layer is in contact with the bottom of said fifth semiconductor region as well as said first semiconductor region.

9. A semiconductor device according to claim 8, further comprising:

a silicon nitride film formed on part of the surface of said insulation layer.

10. A semiconductor device according to claim 1, wherein said highly conductive region is said high-impurity-concentration semiconductor region.

11. A semiconductor device according to claim 1, wherein said highly conductive region comprises one of refractory metal and silicide of the refractory metal.

12. A semiconductor device according to claim 1, wherein at least .a part of said insulation layer is buried in said first semiconductor region and another part thereof is in contact with said second semiconductor region.

13. A semiconductor device according to claim 12, further comprising:

a silicon nitride film formed on the upper surface of said insulation layer.

14. A semiconductor device according to claim 2, wherein said insulation layer is made of silicon oxide.

15. A semiconductor device according to claim 2, further comprising:
   (a) material formed under said insulation layer, having a lower dielectric constant than $SiO_2$; and
   (b) a metal layer formed inside a groove that is etched in the bottom surface of said first semiconductor region toward said second semiconductor region,
   wherein the material whose dielectric constant is lower than that of $SiO_2$ is in contact with the metal layer.

16. A semiconductor device according to claim 2, wherein each of said fourth and fifth semiconductor regions is composed of a relatively low-impurity-concentration extension and a high-impurity-concentration contact area, the extension and contact area have the same depth from the top surface, and said insulation layer is in contact with the bottoms of the extension and contact area of the fifth semiconductor region.

17. A semiconductor device according to claim 5, further comprising:
   material interposed between said silicon oxide film and the silicon nitride film, having a larger emissivity than $SiO_2$.

18. A semiconductor device as in one of claims 7, 14, 16, and 17, wherein each of said fourth and fifth semiconductor regions is made of a relatively low-impurity-concentration extension and a high-impurity-concentration contact area, and the extensions of said fourth and fifth semiconductor regions face said channel region.

19. A semiconductor device according to claim 3, further comprising:
   a thin insulation film made of material whose lattice constant is substantially equal to that of Si, on the surface of said insulation layer.

20. A semiconductor device according to claim 3, wherein said insulation layer is divided into plural blocks.

21. A semiconductor device according to claim 20, wherein said insulation layer is made of $SiO_2$ and the material whose lattice constant is substantially equal to that of Si formed on the $SiO_2$.

22. A semiconductor device according to claim 20, wherein each of the divided blocks of said insulation layer has substantially vertical sidewalls on which $Si_3N_4$ films are formed.

23. A semiconductor device having an insulated gate, first and second main electrodes, and a channel region between the first and second main electrodes, said semiconductor device comprising:
   (a) a high-impurity-concentration first semiconductor region of a first conductivity type, serving as a first main electrode region;
   (b) a second semiconductor region of a second conductivity type formed on said first semiconductor region;
   (c) a low-impurity-concentration third semiconductor region formed on said second semiconductor region;
   (d) a high-impurity-concentration fourth semiconductor region of said first conductivity type formed at the upper surface and in said third semiconductor region, serving as a second main electrode region;
   (e) an insulation layer formed under said fourth semiconductor region;
   (f) a groove extending from a top surface of said third semiconductor region to said first semiconductor region; and
   (g) a gate insulation film and a gate electrode formed along the surface of said groove.

24. A semiconductor device according to claim 23, further comprising:
   a low-impurity-concentration fifth semiconductor region having said first conductivity type formed between said first and second semiconductor regions.

25. A semiconductor device having an insulated gate, first and second main electrodes, and a channel region between the first and second main electrodes, said semiconductor device comprising:
   (a) a high-impurity-concentration first semiconductor region of a first conductivity type, serving as a first main electrode region;
   (b) a second semiconductor region of a second conductivity type formed on said first semiconductor region;
   (c) a low-impurity-concentration third semiconductor region formed on said second semiconductor region;
   (d) a high-impurity-concentration fourth semiconductor region of second conductivity type formed at the upper surface and in said third semiconductor region, serving as a second main electrode region;
   (e) an insulation layer formed under said fourth semiconductor region;
   (f) a groove extending from a top surface of said third semiconductor region to said first semiconductor region;
   (g) a gate insulation film and a gate electrode formed along the surface of said groove; and
   (h) a highly conductive region for connecting said first and second semiconductor regions with each other.

26. A semiconductor device according to claim 25, further comprising:
   a low-impurity-concentration fifth semiconductor region having said first conductivity type formed between said first and second semiconductor regions.

27. A semiconductor device according to claim 26, further comprising a high-impurity-concentration sixth semiconductor region of first conductivity type formed on said third semiconductor region in contact with said fourth semiconductor region.

* * * * *